United States Patent

Kimura et al.

Patent Number: 6,025,222
Date of Patent: *Feb. 15, 2000

[54] VAPOR PHASE GROWTH OF A DIELECTRIC FILM AND A FABRICATION PROCESS OF A SEMICONDUCTOR DEVICE HAVING SUCH A DIELECTRIC FILM

[75] Inventors: Takafumi Kimura; Hideaki Yamauchi; Masaaki Nakabayashi, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/387,297

[22] Filed: Feb. 10, 1995

[30] Foreign Application Priority Data

Mar. 9, 1994 [JP] Japan ................................ 6-038711

[51] Int. Cl.$^7$ ................................................ H01L 21/316
[52] U.S. Cl. ................ 438/240; 438/778; 427/255.31; 427/255.32
[58] Field of Search .................. 437/235, 243; 427/255.3, 255.31, 255.32; 438/778, 240

[56] References Cited

U.S. PATENT DOCUMENTS

| | | | |
|---|---|---|---|
| 3,775,265 | 11/1973 | Bharucha et al. | 204/33 |
| 4,501,602 | 2/1985 | Miller et al. | 65/18.2 |
| 5,204,314 | 4/1993 | Kirlin et al. | 505/1 |
| 5,209,952 | 5/1993 | Erdmann et al. | 427/255.6 |
| 5,362,328 | 11/1994 | Gardiner et al. | 118/726 |
| 5,372,850 | 12/1994 | Uchikawa et al. | 427/255.3 |
| 5,462,899 | 10/1995 | Ikeda | 437/238 |

FOREIGN PATENT DOCUMENTS

| | | |
|---|---|---|
| 0342009 | 11/1989 | European Pat. Off. . |
| 2-225317 | 9/1990 | Japan ............ C01F 11/04 |
| 2225317 | 9/1990 | Japan . |
| 5-117855 | 5/1993 | Japan ............ C23C 16/18 |
| 5-287534 | 11/1993 | Japan ............ C23C 16/18 |
| 6-157191 | 6/1994 | Japan ............ C30B 25/02 |
| 5287534 | 11/1994 | Japan . |

OTHER PUBLICATIONS

Eimori, T. et al. "A Newly Designed Planar Stacked Capacitor Cell with High dielectric Constant Film for 256Mbit DRAM", IEDM93–631.

Kimura et al, 'Synthesis of Novel Sr Sources for Metal Organic Chemical Vapor Deposition of SrTiO$_3$,' Jpn. J. Appl. Phys., Part 1 (1994), 33(9B), 5119–24.

Kimura, Takafumi, 'Synthesis of Novel Sr Sources for Metal Organic Chemical Vapor Dep. of SrTiO$_3$', Jpn, J. Appl. Phys., Part 1 (1994(, 33(9B), 5119–24.

*Primary Examiner*—Charles Bowers
*Assistant Examiner*—Matthew Whipple
*Attorney, Agent, or Firm*—Armstrong, Westerman, Hattori, McLeland & Naughton

[57] ABSTRACT

A method for growing a dielectric film containing Sr on a substrate includes the steps of: dissolving a Sr compound containing $Sr((CH_3)_5C_5)_2$ into an organic solvent or mixing $Sr(thd)_2$ and an amine compound to form a source material; vaporizing the source material to produce a gaseous source material; and decomposing the gaseous source material, obtained in the step of vaporization, in the vicinity of a surface of a substrate held in a reaction chamber, to cause a deposition of a dielectric film containing Sr upon the surface of the substrate.

18 Claims, 11 Drawing Sheets

VAPOR PHASE GROWTH OF A DIELECTRIC FILM AND A FABRICATION PROCESS OF A SEMICONDUCTOR DEVICE HAVING SUCH A DIELECTRIC FILM

BACKGROUND OF THE INVENTION

The present invention generally relates to fabrication of semiconductor devices and more particularly to a method for growing a dielectric film by means of a vapor phase process and a fabrication process of a semiconductor device having a dielectric film thus formed.

With development of fine lithographic patterning processes, large capacity semiconductor memory devices having a storage capacity exceeding 256 Mbits or 1 Gbits are studied intensively, particularly in relation to DRAMs. In such large capacity DRAMs, on the other hand, there emerges a problem in that memory capacitors, which are used in DRAMs for storing information in the form of electric charges, cannot provide sufficient electric capacitance due to excessive miniaturization of the device and hence the capacitor area. Thus, it is necessary in such a large capacity semiconductor memory devices to increase the height of the miniaturized memory cell capacitors in order to secure sufficient capacitance, while use of such a tall capacitor inevitably invites a difficulty in conducting exposure by means of high resolution optical system that has a characteristically limited focal depth. It should be noted that there appears a step on the substrate of such a semiconductor device between the memory cell region in which the tall memory cell capacitors are formed and the peripheral circuit region in which no tall capacitors are formed.

In order to circumvent such a problem, there is a proposal to form the memory cell capacitor in the form of stacked fins such that the surface area of the memory cell capacitor is increased without increasing the height of the capacitor. However, such an approach is successful only for those memory devices having a storage capacity of less than 256 Mbits. When the storage capacity exceeds 256 Mbits, it is difficult to suppress the increase in the height of the memory cell capacitor.

In view of such a restriction in the structure, current DRAMs are generally constructed to have extremely reduced thickness for the dielectric film formed of $SiO_2$ or SiN, in the order of several nanometers or less, such that the capacitance of the memory cell capacitor is maximized. On the other hand, further reduction in the thickness of the dielectric film is difficult in view of possible formation of pinholes or other defects in such thin dielectric films. Further, there is a possibility that tunneling current may flow through such thin dielectric films to cause dissipation of the accumulated electric charges and hence information.

Thus, it has been difficult in the conventional large capacity DRAMs of 256 Mbits or 1 Gbits to have a memory cell capacitor of which capacitance exceeds several femto Farads (fF).

Under such a situation, there is a demand for a technology that enables deposition of dielectric films having a dielectric constant substantially larger than the dielectric constant of the dielectric films currently used in the fabrication of semiconductor memory devices. Particularly, use of strontium titanate ($SrTiO_3$), barium titanate ($BaTiO_3$), or their solid solution (($Sr, Ba)TiO_3$) is thought promising in view of very large dielectric constants of these materials. Further, the technology for forming a film of $SrTiO_3$ or other dielectric films of Sr is not only useful in the fabrication of semiconductor memory devices but also in the fabrication of novel transistors such as dielectric base transistor described in the U.S. Pat. No. 5,291,274 or high temperature superconductors such as $Bi_2Sr_2Ca_2Cu_3O_X$.

In the fabrication semiconductor devices, it is particularly preferable and advantageous to deposit the dielectric film of Sr by a vapor phase process such as CVD process. In the conventional CVD process of dielectric films that contain Sr, Werner complexes such as $Sr(thd)_2$ (2,2,6,6-tetramethyl-3, 3-heptanodionato strontium) known also as $Sr(DPM)_2$ (bis(dipivaloylmethanato)strontium) or $Sr(HFA)_2$ (hexafluoloacetylacetonato strontium) have been used as a source material. As these substances are solid at the room temperature, these materials are heated when conducting a CVD process to procure a gaseous source material. The gaseous source material thus obtained is then supplied to a reaction chamber for deposition on a substrate.

In such a heating process, it is necessary to heat the source material to a temperature of 200° C. or more in correspondence to the high sublimation temperature of these substances. It should be noted that $Sr(thd)_2$ has a sublimation temperature in the range between 200–250° C. This means that the gaseous source material thus produced has to be held at 200° C. or higher until it reaches the reaction chamber and that a specially constructed piping system or line be used for supplying such a high temperature source gas.

In the conventional CVD process of these dielectric films, the solid source material is once dissolved into an organic solvent, wherein the desired gaseous source material of Sr is obtained from the liquid source material thus formed. For example, the formation of a $SrTiO_3$ film from $Sr(thd)_2$ may be started with a process of dissolving $Sr(thd)_2$ into a solution of THF (tetrahydrofuran) with a concentration of 0.01–0.1 mol/l, followed by formation of gaseous source materials from the liquid source material thus formed. Thereby, it should be noted that one cannot obtain necessary vapor pressure for deposition of the dielectric film as long as the vaporization of the gaseous source material is conducted at the room temperature. Thus, the vaporization of the gaseous source material has to be conducted at a temperature of 200° C. or more. Conventionally, the liquid source material is therefore supplied to a preheat furnace held at 200° C. by means of a pump while controlling the flowrate of the same, for causing a vaporization of the gaseous source material. The gaseous source material thus vaporized in the preheat furnace is then admixed with tetraisopropoxy titanium ($Ti(o-i-C_3H_7)_4$), a source of Ti, as well as with oxygen in a mixing chamber and is further forwarded to a reaction chamber, wherein a film of $SrTiO_3$ is deposited on a substrate held at a temperature of 600° C.

In such a conventional process that includes the step of heating the liquid source material of $Sr(thd)_2$ in a preheat furnace at 200° C. prior to the deposition, it should be noted that the temperature of the gaseous source material thus formed has to be maintained within the range of 200–205° C. in order to avoid deposition of material in the line that extends from the preheat furnace to the reaction chamber as well as to achieve the desired vapor pressure. When the temperature decreases below 200° C., the gaseous source material of $Sr(thd)_2$ may cause a condensation. On the other hand, such a requirement indicates that one has to use a complex temperature control system in addition to the use of refractory material and construction for the line.

It should be noted that heating of $Sr(thd)_2$, either in the form of solid or in the form of liquid dissolved in an organic solvent, may cause a deterioration of in $Sr(thd)_2$ as a result of reaction with excessive thds contained in the source material or other impurities such as $O_2$, $CO_2$, CO, $H_2O$, and the like, without forming $Sr(thd)_2$. When such a deterioration occurs in the $Sr(thd)_2$ source material, the source material may not vaporize completely, even when heated to a predetermined temperature. Further, use of such deteriorated source material may result in a change in the vapor pressure of the gaseous source material produced as a result of vaporization.

Because of this, conventional $Sr(thd)_2$ source materials cannot be used more than several times and frequent replacement of the source material has been needed. However, the source material of $Sr(thd)_2$ that is available at present generally has a purity that changes in a wide range, and it has been needed to optimize the deposition condition each time a new source material is loaded. Because of this, it has been difficult to fabricate the semiconductor devices that use a dielectric film of Sr in a production line.

SUMMARY OF THE INVENTION

Accordingly, it is a general object of the present invention to provide a novel and useful vapor phase growth process of a dielectric film and a fabrication process of a semiconductor device that uses such a dielectric film wherein the foregoing problems are eliminated.

Another and more specific object of the present invention is to provide a vapor phase growth process of a dielectric film that contains Sr as well as a fabrication process of a semiconductor device that uses such a dielectric film, wherein the process includes a step of converting a solid source material of Sr into another source material having a lower vaporization temperature and conducting a deposition of the dielectric film using the source material thus converted.

Another object of the present invention is to provide a process for growing a dielectric film containing Sr on a substrate and a fabrication process of a semiconductor device that uses such a dielectric film, comprising the steps of:

dissolving a compound containing $Sr((CH_3)_5C_5)_2$ into an organic solvent to form a liquid source material;

vaporizing said liquid source material to produce a gaseous source material; and decomposing said gaseous source material, obtained in said step of vaporization, in the vicinity of a surface of a substrate held in a reaction chamber, to cause a deposition of a dielectric film containing Sr upon said surface of said substrate.

According to the present invention, it is possible to obtain a gaseous source material of Sr by conducting a vaporization at a temperature of 100–150° C., which is substantially lower than the conventionally used temperature. As a result of decrease in the temperature, it is possible to simplify the construction of the line used for supplying the gaseous source material to the vapor phase growth apparatus substantially. Particularly, it should be noted that the temperature regulation of the line used for supplying the source material is substantially facilitated as a result of the reduced temperature of the line. Thereby, it is possible to supply the gaseous source material of Sr to the reaction chamber with a stabilized vapor pressure, without causing a deposition in the line. As a result of the present invention, is possible to produce the gaseous source material of Sr repeatedly with a stabilized, reproducible vapor pressure. Thereby, it is possible to obtain a dielectric film of Sr with a reproducible composition. One may use any solvents that are used conventionally in the art as the organic solvent for dissolving $Sr((CH_3)_5C_5)_2$. Further, it is preferable that the foregoing Sr source compound contains an adduct for stabilizing the $Sr((CH_3)_5C_5)_2$ compound such as tetrahydrofuran (THF). Thereby, the source compound of Sr is represented as $Sr((CH_3)_5C_5)_2$ $(THF)_2$.

Another object of the present invention is to provide a process for growing a dielectric film containing Sr on a substrate and a fabrication process of a semiconductor device that uses such a dielectric film, comprising the steps of:

mixing $Sr(thd)_2$ with an amine compound to form a mixture;

vaporizing said mixture to produce a gaseous source material; and decomposing said gaseous source material in the vicinity of a surface of a substrate held in a reaction chamber to cause a deposition of a dielectric film containing Sr upon said substrate.

According to the present invention, it is possible to lower the sublimation temperature of $Sr(thd)_2$, which is used in the present invention as a solid source material of Sr, to the temperature range of 100–150° C. by mixing an amine compound thereto. As a result, it is possible to conduct a vapor phase growth of a dielectric film without substantially changing the construction of the conventional vapor phase growth apparatus. Associated with such a decrease in the temperature of the gaseous source material, one can achieve the temperature regulation of the line used for supplying the source material relatively easily, and it becomes possible to supply a gaseous source material to the reaction chamber with a stabilized, reproducible vapor pressure, without causing deposition in the line. Thereby, it is possible to obtain a dielectric film having a desired composition, with excellent reproducibility. It is preferable to use a normal chain compound such as triethylentetramine or tetraethylenepentamine as the foregoing amine compound.

Other objects and further features of the present invention will become apparent from the following detailed description when read in conjunction with the attached drawings.

DETAILED DESCRIPTION OF PREFERRED EMBODIMENTS

Figure 1:
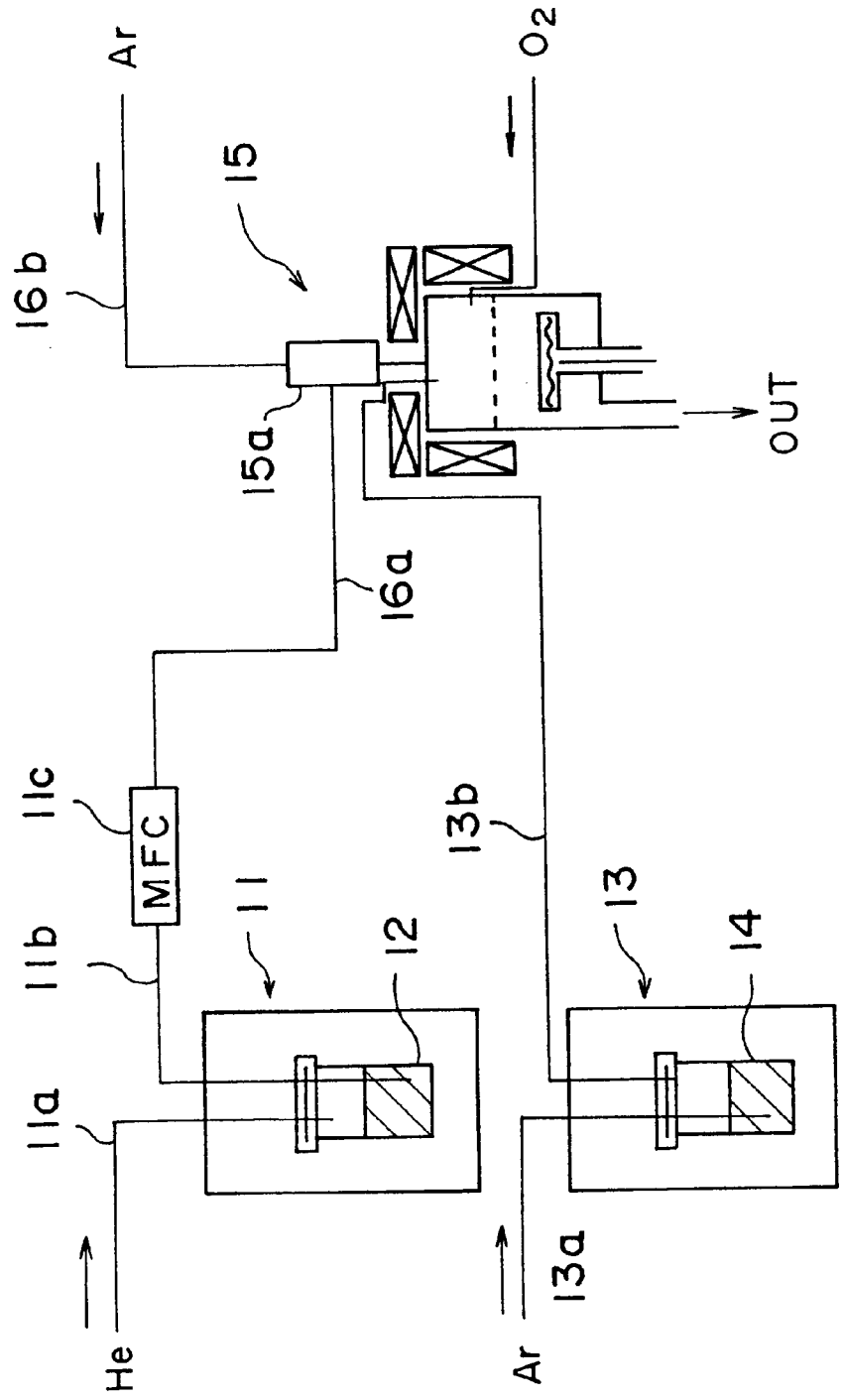
FIG. 1 is a diagram showing the construction of a CVD apparatus used in a first embodiment of the present invention.

FIG. 1 shows the CVD apparatus used in the present invention schematically.

Referring to FIG. 1, the CVD apparatus includes a first container 12 held in a first thermostatic bath 11 for holding a first source material at a predetermined temperature, a second container 14 held in a second thermostatic bath 13 for holding a second source material at a predetermined temperature, and a reaction chamber 15 supplied with the first and second source materials from the first and second containers for growing a dielectric film on a substrate held therein. It should be noted that the first container 12 is supplied with a first carrier gas from a primary-side line 11a while the second container 14 is supplied with a second carrier gas from another primary-side line 13a, wherein the first and second carrier gases thus supplied cause a bubbling or pressurization in the first and second containers 12 and 14. Thus, the source material in the container 12 is supplied to the reaction chamber 15 via a secondary-side line 11b while the source material in the container 14 is supplied to the reaction chamber 15 via another secondary-side line 13b.

[First Embodiment]

Hereinafter, the CVD growth of a SrTiO$_3$ film according to a first embodiment of the present invention will be explained.

In the present embodiment, a liquid source material, which is formed by dissolving a Sr compound having a formula Sr((CH$_3$)$_5$C$_5$)$_2$·(THF)$_2$ into an organic solvent such as THF, is held in the container 12 in place of the compound of Sr(thd)$_2$, which has been used conventionally. The liquid source material in the container 12 is pressurized by a He gas supplied from the line 11a as a carrier gas and is transported to a preheat chamber 15a provided adjacent to the reaction chamber 15, after passing through the liquid mass flow controller 11c.

It should be noted that the liquid source material held in the container 12 is formed by dissolving Sr((CH$_3$)$_5$C$_5$)$_2$·(THF)$_2$ in a high purity THF solvent with a concentration of 0.01–0.09 mol/l, typically a concentration of 0.05 mol/l, wherein the THF solvent is subjected to a purification process for removing therefrom impurities such as H$_2$O, O$_2$, CO$_2$, CO, and the like. The source material thus formed is a liquid at the room temperature and has a vaporization temperature of 100–150° C. in the pressure range of 0.01–150 Torr. The Sr compound Sr((CH$_3$)$_5$C$_5$)$_2$·(THF)2 has a structural formula represented as

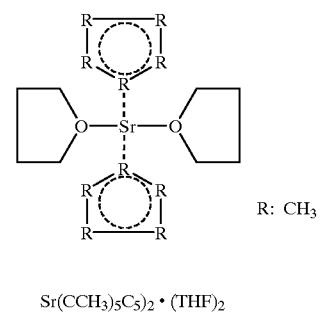

Sr(CCH$_3$)$_5$C$_5$)$_2$ · (THF)$_2$ and is supplied to the preheat chamber 15a through a stainless steel tube forming the foregoing secondary line 11b by means of a pressurized He gas under control by the mass flow controller 11c. Typically, the stainless steel tube has an inner diameter of ¹⁄₁₆ inches and the liquid source material is transported through the tube to the preheat chamber 15a, with a flowrate of 0.02–0.20 SCCM by means of the pressurized He gas of which pressure is set to 4.0 kgf/cm². In the foregoing formula, it should be noted that the two THF groups added to the metal organic complex Sr((CH$_3$)$_5$C$_5$)$_2$ act to stabilize the compound Sr((CH$_3$)$_5$C$_5$)$_2$ and may be replaced by other groups that act similarly. It should be noted that the thermostatic bath 11 holds the container 12 at 25° C. As the liquid source material is transported to the preheat chamber 15a in the liquid state, heating of the container 12 is not made.

On the other hand, the second container 14 contains Ti(o-i-C$_3$H$_7$)$_4$, which is used commonly for the source of Ti. Thus, the Ti source material in the container 14 is subjected to a bubbling process by an Ar gas that is supplied via the primary side line 13a with a flowrate of 50 SCCM, and the Ti source gas is supplied to a mixing chamber 15d of the reaction chamber 15 via the secondary side line 13b. It should be noted that the container 14 holds the Ti(o-i-C$_3$H$_7$)$_4$ source material at a temperature of 40° C. under the internal pressure of 760 Torr.

The source material from the container 12 is supplied to a line 16b, wherein an Ar gas is supplied to the preheat chamber 15a via the line 16b with a flowrate of 500–1000 SCCM. Further, O$_2$ is supplied substantially simultaneously to the mixing chamber 15d via another line 16c with a flowrate of typically 200–500 SCCM.

Figure 2:
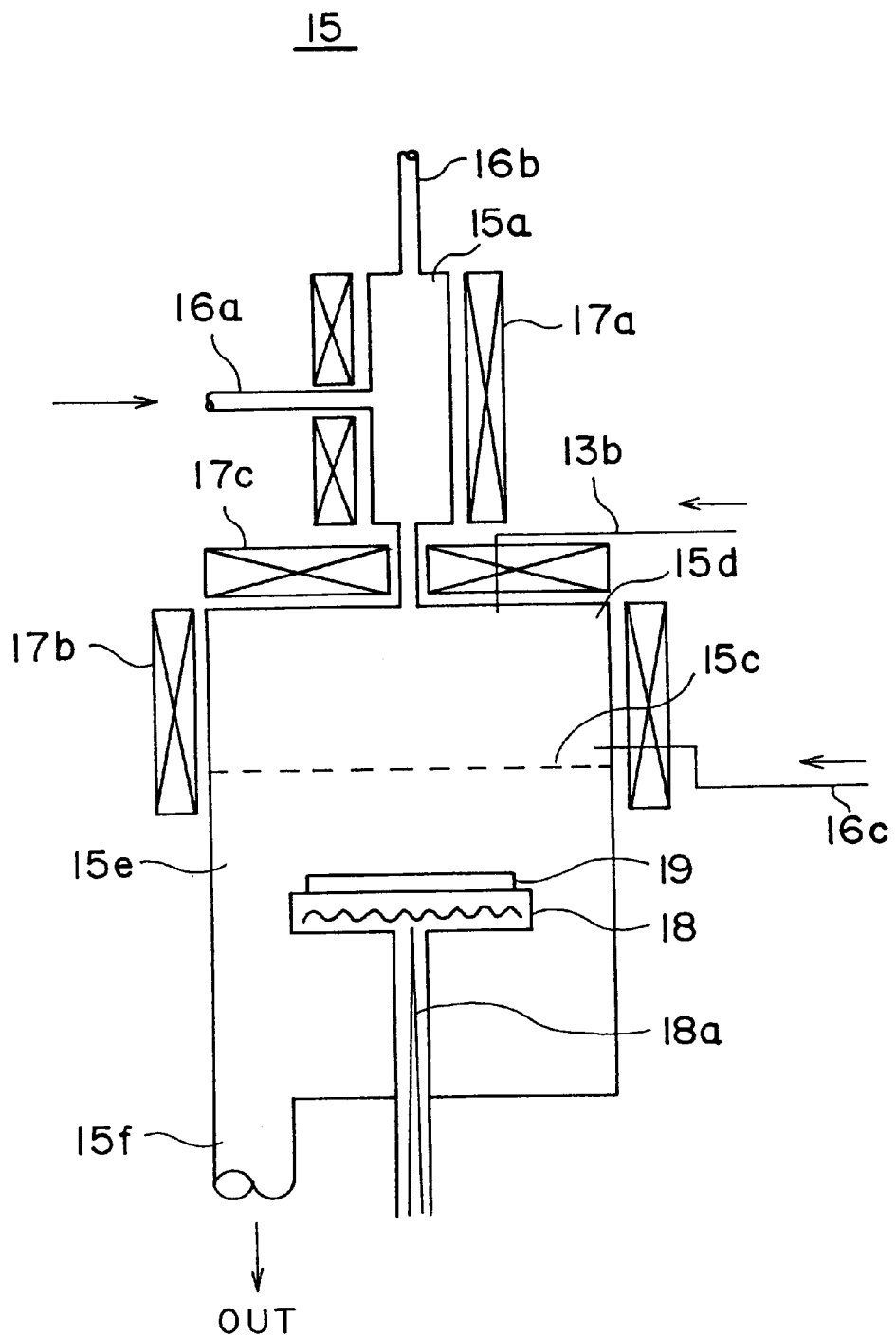
FIG. 2 is a diagram showing the essential part of the present invention of FIG. 1.

FIG. 2 shows the construction of the reaction chamber 15 and the preheat chamber 15a of FIG. 1 in detail.

Referring to FIG. 2, the preheat chamber 15a is surrounded by a heating jacket 17a such that the heating jacket 15a holds the temperature inside the preheat chamber 15a at 100–150° C. As a result, the liquid source material supplied from the line 16a, particularly the metal organic complex Sr((CH$_3$)$_5$C$_5$)$_2$ causes a sublimation. Typically, the pressure inside the preheat chamber 15a is set to 40 Torr and the heating jacket 17a controls the temperature of the preheat chamber 15a at 130° C. Thereby, the liquid source material supplied from the line 16a causes a complete vaporization, and the gaseous source material formed as a result of the vaporization is supplied to a mixing chamber 15d provided at an inlet side of the reaction chamber 15.

As indicated in FIG. 2, there is provided different heating jackets 17b and 17c in the path of the source material extending from the mixing chamber 15d or from the preheat chamber 15a to the mixing chamber 15d for heating the gaseous source material discharged from the preheat chamber 15a to a temperature higher than the preheat chamber 15a. For example, the gaseous source material is heated to a temperature of 135±5° C. Thereby, the condensation of Sr((CH$_3$)$_5$C$_5$)$_2$, characterized by a high sublimation temperature, is successfully avoided and no deposition of Sr compound occurs on the inner wall of the mixing chamber 15d or on the inner wall of the passage of the gaseous source material extending from the preheat chamber 15a to the mixing chamber 15d.

As explained previously, the mixing chamber 15d is supplied with Sr((CH$_3$)$_5$C$_5$)$_2$·(THF)$_2$ via the line 16a, Ti(o-i-C$_3$H$_7$)$_4$ via the line 13b, and further with O$_2$ via the line 16c. Thereby, the gaseous source of Sr((CH$_3$)$_5$·C$_5$)$_2$·(THF)$_2$ is supplied to the mixing chamber 15d from the preheat chamber 15a while the mixing chamber 15d is further supplied with O$_2$ from the line 16c. Further, the mixing chamber 15d is supplied with Ti(o-i-C$_3$H$_7$)$_4$ from the line 13b. These gaseous source materials are then supplied from the mixing chamber 15d to a deposition chamber 15e via a shower head 15c that is provided at the boundary between the mixing chamber 15d and the deposition chamber 15e.

It should be noted that the deposition chamber 15e is evacuated through an evacuation port 15f such that the internal pressure is held at a predetermined pressure such as 10 Torr. The deposition chamber 15e is provided with a stage 18 equipped with a thermocouple 18a for supporting a substrate 19, and the source gas introduced to the deposition chamber 15e from the foregoing shower head 15c causes a decomposition on the substrate 19. Thereby, a film of SrTiO$_3$ is deposited on the substrate 19.

Next, the experiment conducted by the apparatus of FIGS. 1 and 2 will be explained in detail.

In the experiment described below, a (100)-oriented silicon substrate having a thickness of 650 μm was used for the substrate 19, and a deposition of a film of SrO was made on the substrate 19 instead of depositing a SrTiO$_3$ film, for examining the supply of Sr to the reaction chamber 15. Prior to the deposition of the SrO film, a SiO$_2$ film having a thickness of 100 nm was deposited, followed by deposition of a Ta layer and a Pt layer each having a thickness of 50 nm. Thus, the deposition of the SrO film was made on the Pt layer thus formed with a deposition rate of 100 nm/h.

Experiment 1-1

In the present experiment, a liquid source material was prepared by dissolving Sr((CH$_3$)$_5$C$_5$)$_2$·(THF)$_2$ into the THF solvent with a concentration of 0.05 mol/l. The liquid source material thus prepared was then supplied to the preheat chamber 15a together with O$_2$ with a flow rate of 0.01–0.05 SCCM. The flowrate of O$_2$ was thereby set to 200–500 SCCM as explained previously. Further, the internal pressure of the preheat chamber 15a, used for vaporizing the Sr((CH$_3$)$_5$C$_5$)$_2$·(THF)$_2$, was set to 40 Torr. In the reaction chamber 15, on the other hand, the temperature of the substrate 19 was set to 600° C., and the deposition of the SrO film was made on the substrate 19 while setting the temperature of the preheat chamber to 100° C.

In the present experiment, no deposition of SrO film was observed on the substrate 19. This clearly indicates that the temperature of the preheat chamber 15a was too low and the vapor pressure of the Sr((CH$_3$)$_5$C$_5$)$_2$ was insufficient for causing a deposition of a SrO film on the substrate.

Experiment 1-2

In the present experiment, the same liquid source material as in the case of the experiment 1-1 was used, and deposition of a SrO film was attempted in the same deposition condition except that the temperature of the preheat chamber 15a is set to 110 ° C. In the present experiment, too, no deposition of an SrO film was observed.

Experiment 1-3

In the present experiment, the same liquid source material as in the case of the experiment 1-1 was used, and the deposition of a SrO film was attempted in the same deposition condition except that the temperature of the preheat chamber 15a is set to 120° C. In the present experiment, too, no deposition of an SrO film was observed.

Experiment 1-4

In the present experiment, the same liquid source material as in the case of the experiment 1-1 was used, and the deposition of a SrO film was attempted in the same deposition condition except that the temperature of the preheat chamber 15a is set to 130° C. In this experiment, a successful deposition of a SrO film was observed on the substrate 19.

Figure 3:
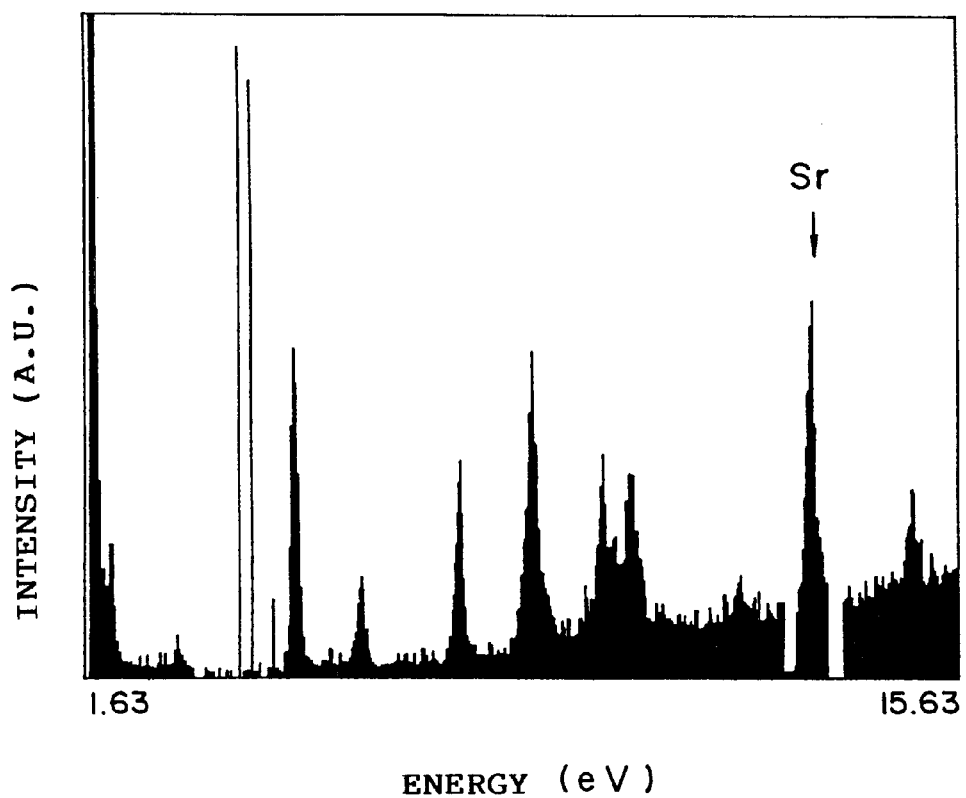
FIG. 3 is a diagram showing an XRF pattern of a dielectric film obtained by the first embodiment of the present invention.

FIG. 3 shows the result of the XRF (X-ray fluorescent) analysis conducted upon the SrO film obtained in the experiment 1-4. As can be seen from FIG. 3, the film grown on the substrate 19 includes Sr.

Figure 4:
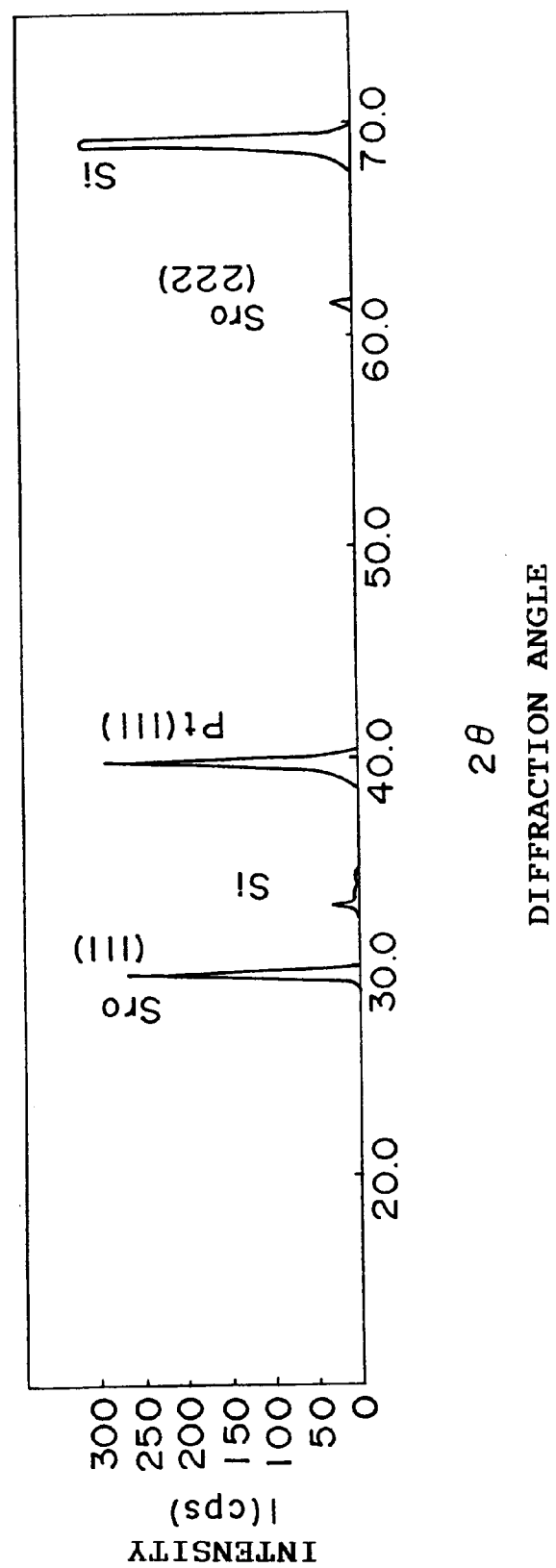
FIG. 4 is a diagram showing an X-ray diffraction pattern of a dielectric film obtained by the first embodiment of the present invention.

FIG. 4 shows the XRD (X-ray diffraction) pattern of the SrO film obtained by the experiment 1-4. It will be noted that the diffraction pattern of FIG. 4 shows a clear diffraction peak of SrO.

As described heretofore, it is possible to use a liquid source material of Sr in the deposition apparatus for growing a film of SrO, wherein the liquid source compound is formed by dissolving Sr((CH$_3$)$_5$C$_5$)$_2$·THF$_2$ in the THF solvent. By using such a liquid source material, it is possible to reduce the temperature of vaporization of the Sr source material from the conventional temperature of 200° C. to 150° C. or less, up to the temperature of 130° C. Here, it should be noted that THF is used as an organic solvent for dissolving Sr((CH$_3$)$_5$C$_5$)$_2$THF$_2$, while other organic solvents such as acetone, xylene, acetic acid and its compound, toluene, benzene, and the like may also be used for the purpose. Further, it should be noted that the foregoing organic complex of Sr, Sr((CH$_3$)$_5$C$_5$)$_2$·THF$_2$ includes the THF adduct merely for stabilizing the compound. Thus, the THF adduct of the foregoing complex may be replaced by other suitable group(s).

[Second Embodiment]

Next, the second embodiment of the present invention will be described.

In the present embodiment, Sr(thd)$_2$ is used for the source of Sr, wherein it will be noted that Sr(thd)$_2$ is the Werner complex that has been used conventionally as the source of Sr. In the present embodiment, however, the compound Sr(thd)$_2$ is admixed with amine compound in order to reduce the sublimation temperature of Sr(thd)$_2$. In order to achieve the desired decrease of the sublimation temperature, it is desirable to mix the Sr(thd)$_2$ compound with a compound having a vaporization temperature close to the sublimation temperature of Sr(thd)$_2$.

Figure 5:
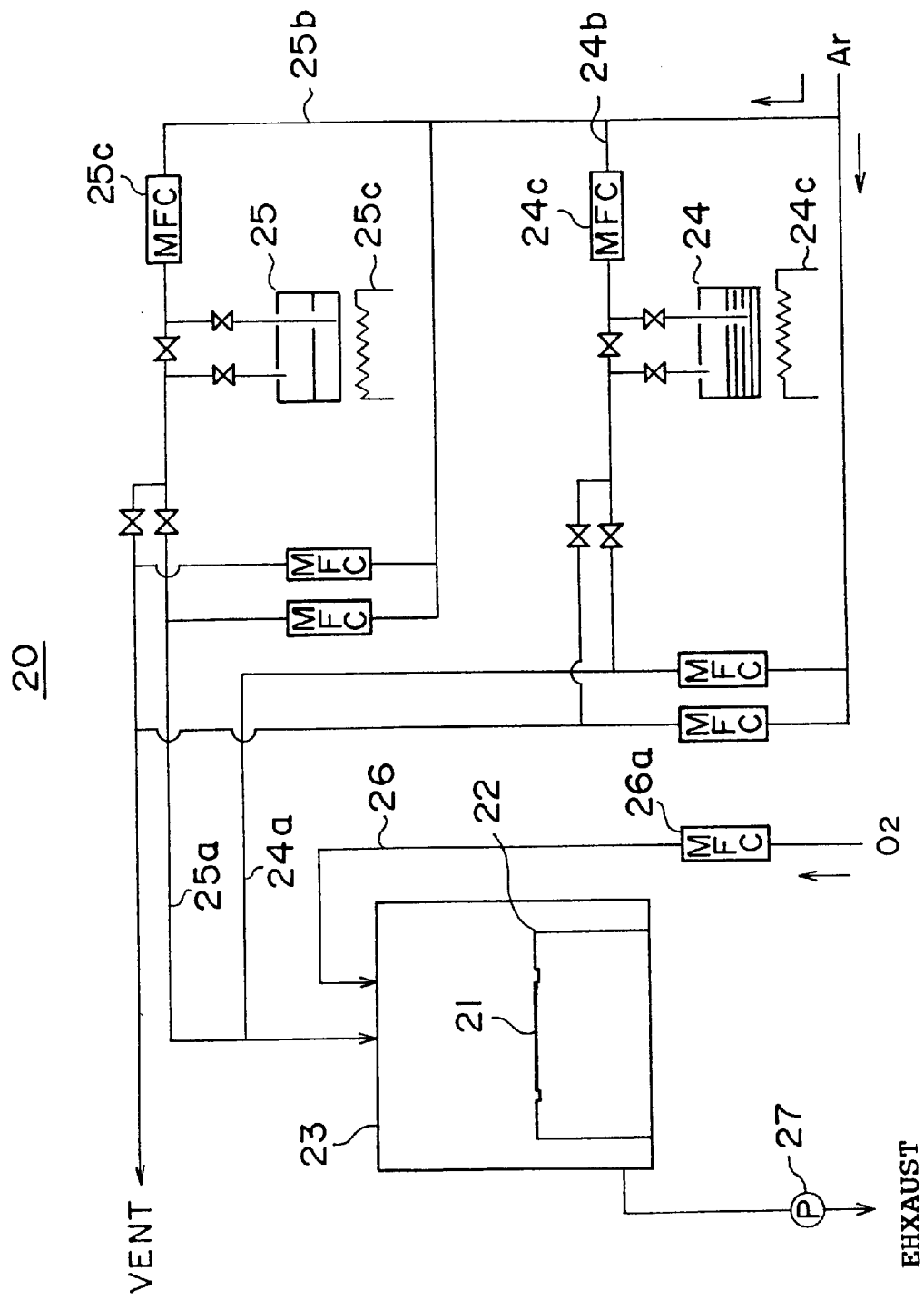
FIG. 5 is a diagram showing the construction of a CVD apparatus used in the second embodiment of the present invention.

FIG. 5 shows the general construction of a CVD apparatus 20 used in the present embodiment.

Referring to FIG. 5, the CVD apparatus 20 itself has a construction that has been used conventionally and includes a reaction chamber 23 that accommodates a stage 22 on which a substrate 21 is supported. The reaction chamber 23 is evacuated by a pump 27 and containers 24 and 25 of source materials are connected to the reaction chamber 23 via respective lines 24a and 25a. Further, $O_2$ is supplied to the reaction chamber 23 for the desired deposition of the oxide dielectric film via a line 26 and a mass flow controller 26a on the line 26. Thus, the containers 24 and 25 are respectively supplied with a carrier gas such as Ar via respective lines 24b and 25b as well as via corresponding mass flow controllers 24c and 25c, wherein the carrier gas thus introduced in the containers 24 and 25 form a source gas by causing a bubbling therein. The source gases thus formed in the containers 24 and 25 are then supplied to the reaction chamber 23 via the lines 24a and 25a as described already. It should be noted that the construction of FIG. 5 includes various bypass lines not illustrated. The containers 24 and 25 are held in respective thermostatic baths 24c and 25c that hold the source materials in the containers 24 and 25 at respective predetermined temperatures. Further, the lines extending from the containers 24 and 25 to the reaction chamber 23 are provided with a suitable temperature regulation such that no substantial condensation of the source materials occurs in the lines.

It should be noted that the present embodiment forms a $SrTiO_3$ film on the substrate 21. Thus, the container 24 accommodates $Ti(o-i-C_3H_7)_4$ therein while the container 25 accommodates a mixture of $Sr(thd)_2$ and an amine compound.

Hereinafter, the experiments conducted by the apparatus of FIG. 5 will be described.

Experiment 2-1

In the present experiment corresponding to the conventional process, $Sr(thd)_2$ alone was accommodated in the container and the deposition of $SrTiO_3$ was made under the following condition.

|  |  |
|---|---|
| substrate temperature | 550° C. |
| substrate | Pt/Ta/SiO$_2$/Si* |
| Ti(o-i-C$_3$H$_7$)$_4$ | |
| vaporization temperature | 35° C. |
| Ar flowrate | 100 cc/min |
| Sr(thd)$_2$ | |
| sublimation temperature | 220° C. |
| Ar flowrate | 100 cc/min |
| O$_2$ flowrate | 1000 cc/min |
| reaction chamber | |
| internal pressure | 5 Torr |
| oxygen concentration | 50% |
| deposition rate | 1.5 nm/min |
| film thickness | ≈200 nm |

*the same substrate used in the first embodiment

Figure 6:
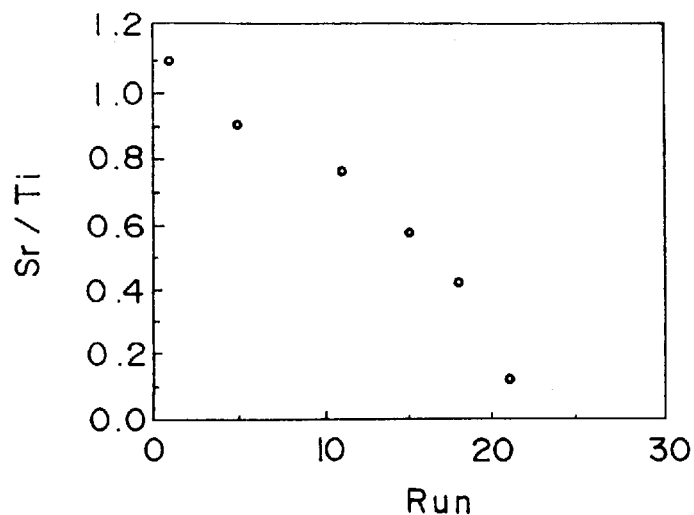
FIG. 6 is a diagram showing the run-to-run compositional change of a Sr-containing dielectric film obtained in the apparatus of FIG. 5 in accordance with an experiment 2-1 of the second embodiment of the present invention, which experiment being conducted under a conventional deposition condition.

FIG. 6 shows the composition of the $SrTiO_3$ film deposited on the substrate 22, wherein the substrate 22 has a construction identical with the substrate used in the first embodiment. In FIG. 6, it will be noted that the composition of the $SrTiO_3$ film changes with respect to Sr and Ti in each run even when the deposition condition is held unchanged. More specifically, the dielectric film obtained immediately after the start of the experiment shows a nearly ideal stoichiometry in which the content of Sr is approximately equal to the content of Ti in terms of atomic fraction, while it will be noted that the Sr content decreases gradually with repetition of the runs. This tendency can be seen also in other deposition conditions and appears particularly conspicuous when the sublimation of $Sr(thd)_2$ is made at high temperatures. It is believed that such a run-to-run change of the $SrTiO_3$ film composition occurs as a result of decrease in the vapor pressure of the Sr gaseous source material, which in turn is caused by the deterioration of the $Sr(thd)_2$ source material as a result of repeated use.

Experiment 2-2

In the present experiment, a mixture of $Sr(thd)_2$ and triethylentetramine ($NH_2CH_2CH_2NHCH_2CH_2NHCH_2CH_2NH_2$; designated hereinafter as "trien" for the sake of convenience), a normal chain amine, was accommodated in the container 25 of FIG. 5 and the deposition of $SrTiO_3$ was made by using such a mixture as the source of Sr. The deposition of the $SrTiO_3$ film was made under a condition set identical to the case of the experiment 2-1, except that the supply of the source of Sr and Ti was made as follows.

$Ti(o-i-C_3H_7)_4$
  temperature 45° C.
  Ar flowrate 10–200 cc/min
$Sr(thd)_2$+trien
  temperature 80–160° C.
  Ar flowrate 50–500 cc/min FIG. 7 shows the relationship between the deposition rate and the temperature of the Sr source material for the case where the ratio between $Sr(thd)_2$ and trien is set to 1:2, wherein the deposition was made by setting the Ar gas flowrate such that the obtained dielectric film of $SrTiO_3$ contains Sr and Ti with the same amount in terms of atomic fraction (Sr:Ti=1:1).

Figure 7:
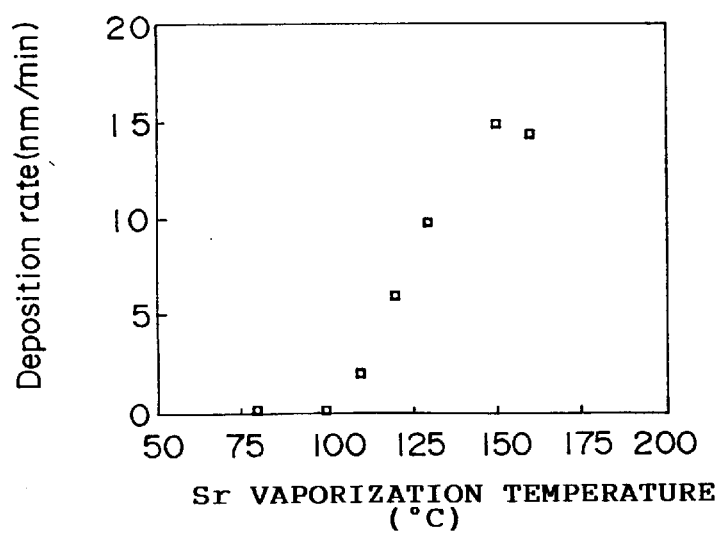
FIG. 7 is a diagram showing the run-to-run compositional change of a Sr-containing dielectric film obtained in the apparatus of FIG. 5 in accordance with an experiment 2-2 of the second embodiment of the present invention, which experiment being conducted under a deposition condition of the present invention.

As will be understood from FIG. 7, no substantial deposition of the dielectric film occurs when the vaporization of the Sr source material is made at a temperature lower than 100° C., indicating that there occurs no substantial vaporization of $Sr(thd)_2$ in such a low temperature condition. On the other hand, once the temperature of vaporization of the Sr source is set higher than 100° C., it was observed that the deposition rate of the $SrTiO_3$ film increases generally linearly until the temperature reaches 150° C. When the temperature of vaporization exceeds 150° C., on the other hand, the deposition rate of $SrTiO_3$ starts to decrease with increasing temperature, indicating that the rate of vaporization of the $Sr(thd)_2$ gas decreases at the temperatures exceeding 150° C. Further, it was found that the reproducibility is lost in the composition of the obtained $SrTiO_3$ film when the temperature of vaporization of the source material is set higher than 150° C. It is believed that this indicates a deterioration occurring in the Sr source material in such a high temperature exceeding 150° C. Further, there is a possibility that trien is vaporizing preferentially over $Sr(thd)_2$.

Figure 8:
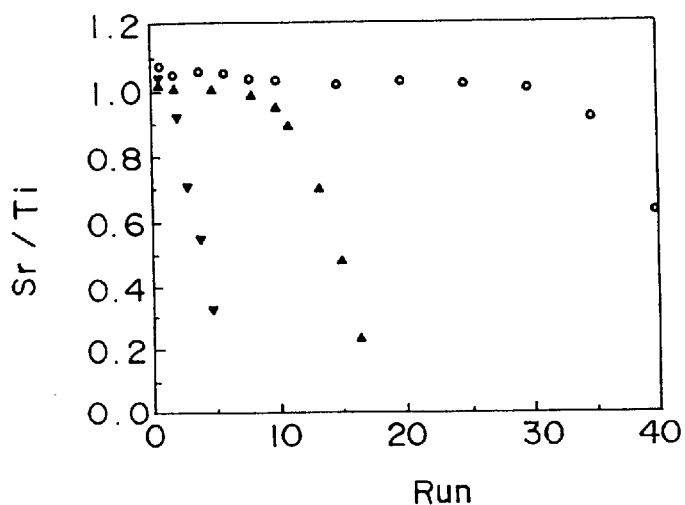
FIG. 8 is a diagram showing the run-to-run compositional change of a Sr-containing dielectric film obtained in the apparatus of FIG. 5 in accordance with the experiment 2-2, which experiment being conducted under various deposition conditions including the condition of the present invention.

FIG. 8 shows the mole ratio of Sr and Ti in the $SrTiO_3$ film obtained when the temperature of vaporization of the Sr source material is set to 130° C. and the Ar flowrate to 500 cc/min such that the ratio of Sr and Ti in the obtained $SrTiO_3$ film is 1:1 at the onset of the deposition. In FIG. 8, it should be noted that the inverted triangles indicate the case where the mixing ratio of trien and $Sr(thd)_2$ is set to 0.5 (trien/Sr(thd)$_2$=0.5) in terms of mole ratio, while normal triangles indicate the case where the mixing ratio of trien and $Sr(thd)_2$ is set to 1 (trien/Sr(thd)$_2$=1) also in terms of mole ratio. Further, the open circles indicate the case where the mixing ratio of trien and $Sr(thd)_2$ is set to 2 (trien/Sr(thd)$_2$=2) in terms of mole ratio. Thus, FIG. 8 clearly indicates that the number of runs that provides a reproducible deposition of the $SrTiO_3$ film in terms of composition, changes depending upon the mole ratio of trien and $Sr(thd)_2$. For example, no reproducible deposition is achieved when the mixing ratio of trien and $Sr(thd)_2$ is set to 0.5, while one can obtain a $SrTiO_3$ film with a reproducible composition up to the tenth run when the foregoing mixing ratio is set to 1. Further, it is possible to obtain a $SrTiO_3$ film with a reproducible composition up to the thirty fifth run when the ratio of trien and $Sr(thd)_2$ is set to 2. A similar result is obtained also when the ratio of trien and $Sr(thd)_2$ is set to 3.

Figure 9:
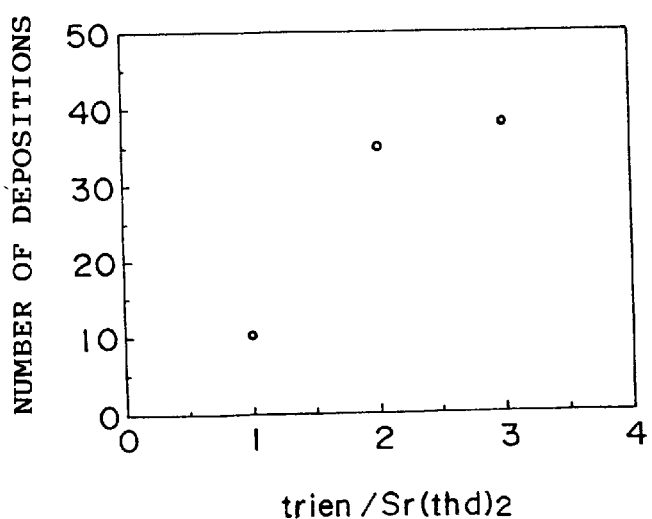
FIG. 9 is a diagram showing the relationship between the mixing ratio of trien and Sr(thd)$_2$ and the number of times the SrTiO$_3$ film can be deposited with a reproducible composition.

FIG. 9 shows the number of runs in which deposition of a $SrTiO_3$ film is made with reproducibility, as a function of the mixing ratio of trien and $Sr(thd)_2$. From FIG. 9, it will be understood that one can achieve deposition of a $SrTiO_3$ film with a reproducible composition by setting the mixing ratio of trien and $Sr(thd)_2$ to be 2 or more.

Experiment 2-3

In the present experiment, a mixture of $Sr(thd)_2$ and tetraethylenepentamine ($HN(CH_2CH_2NHCH_2CH_2NH_2)2$; designated hereinafter as tetraen for the sake of convenience) is accommodated in the container 25 in place of the mixture of $Sr(thd)_2$ and trien used in the experiment 2-2, and deposition of a $SrTiO_3$ film is made on the substrate 21 with a deposition condition set identical to the case of the experiment 2-1 except for the followings.

$Ti(o\text{-}i\text{-}C_3H_7)4$
  temperature 45° C.
  Ar flowrate 10–200 cc/min
$Sr(thd)_2+\text{tetraen}$
  temperature 90–160° C.
  Ar flowrate 50–500 cc/min FIG. 10 shows the relationship between the deposition rate of the $SrTiO_3$ film and the temperature of vaporization of the foregoing Sr source material for the case where the mixing ratio of $Sr(thd)_2$ and tetraen is set to 1:2 in terms of mole ratio, wherein it should be noted that the deposition was made by setting the Ar flowrate such that the obtained $SrTiO_3$ film has a stoichiometric composition in which the ratio of Sr and Ti is 1:1.

Figure 10:
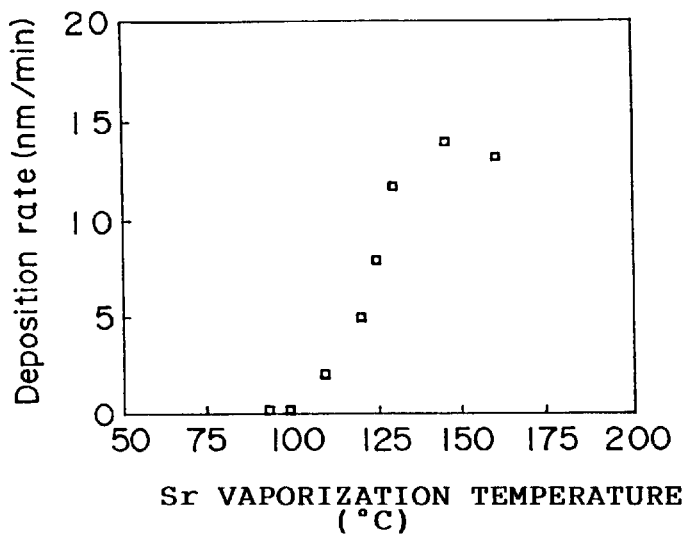
FIG. 10 is a diagram showing the relationship between the deposition rate of the dielectric film deposited from another Sr source material under the conduction of the present invention, as a function of the vaporization temperature of the Sr source material.

Referring to FIG. 10, there occurs no substantial vaporization of $Sr(thd)_2$ and hence the deposition of $SrTiO_3$ film on the substrate as long as the vaporization of the foregoing Sr source is made at a temperature lower than 100° C., while when the vaporization is made at a temperature higher than 100° C., it will be noted that the deposition rate increases generally linearly up to the temperature of about 150° C. When the temperature exceeds 150° C., on the other hand, the deposition rate starts to decrease with increasing temperature, indicating a decrease in the ratio of vaporization of $Sr(thd)_2$ at such a high temperature. Further, it was observed that the obtained dielectric film of $SrTiO_3$ loses reproducibility in the composition when the vaporization of the Sr source is made at a temperature higher than 150° C., indicating that a deterioration occurs in the Sr source material. Further, there is a possibility that tetraen in the Sr source vaporizes preferentially over $Sr(thd)_2$ in such high temperatures.

Figure 11:
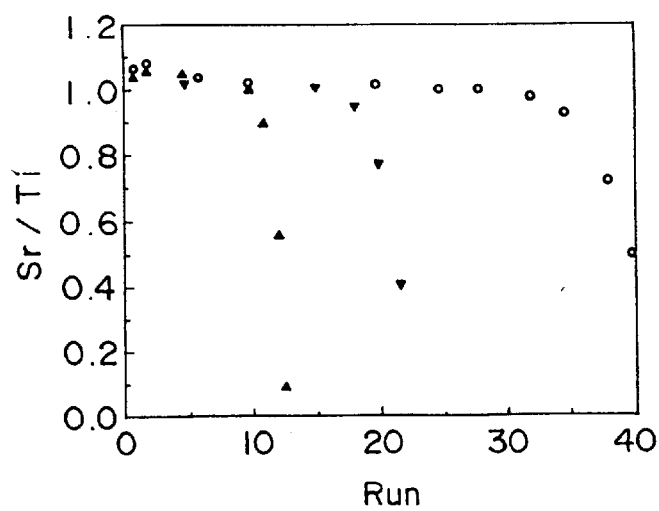
FIG. 11 is a diagram showing the compositional change of Sr-containing dielectric films obtained in the apparatus of FIG. 5 in accordance with an experiment 2-3 of the second embodiment of the present invention, which experiment being conducted under various deposition conditions including the condition of the present invention.

FIG. 11 shows the ratio of Sr and Ti in the $SrTiO_3$ film for each run of the experiment for the case where the Sr source material in the container 25 is vaporized as 125° C. and the Ar gas flowrate is set to 500 cc/min such that the initial composition of the $SrTiO_3$ film has a stoichiometric composition of Sr Ti=1:1 at the onset of the deposition.

Referring to FIG. 11, it should be noted that normal triangles indicate the case where the mixing ratio of tetraen and $Sr(thd)_2$ is set to 1 in mole ratio (tetraen/$Sr(thd)_2$=1) while the lower triangles indicate the case where the mixing ratio of tetraen and $Sr(thd)_2$ is set to 1.5 in mole ratio (tetraen/$Sr(thd)_2$=1.5). Further, the open circles indicate the case where the mixing ratio of tetraen and $Sr(thd)_2$ is set to 2 in mole ratio (tetraen/$Sr(thd)_2$=2). A similar relationship shown by the open circles is obtained also for the case where the mixing ratio of tetraen and $Sr(thd)_2$ is set to 3 in mole ratio (tetraen/$Sr(thd)_2$=3).

As will be noted from FIG. 11, the composition of the $SrTiO_3$ film starts to change after about eight runs when the foregoing ratio is set to 1. When the foregoing mixing ratio is set to 1.5, on the other hand, the composition of the $SrTiO_3$ film starts to change after about 18 runs. On the other hand, it is possible to carry out about 35 runs without causing a substantial compositional change in the $SrTiO_3$ film by setting the mixing ratio of tetraen and $SrTiO_3$ to 2.

Figure 12:
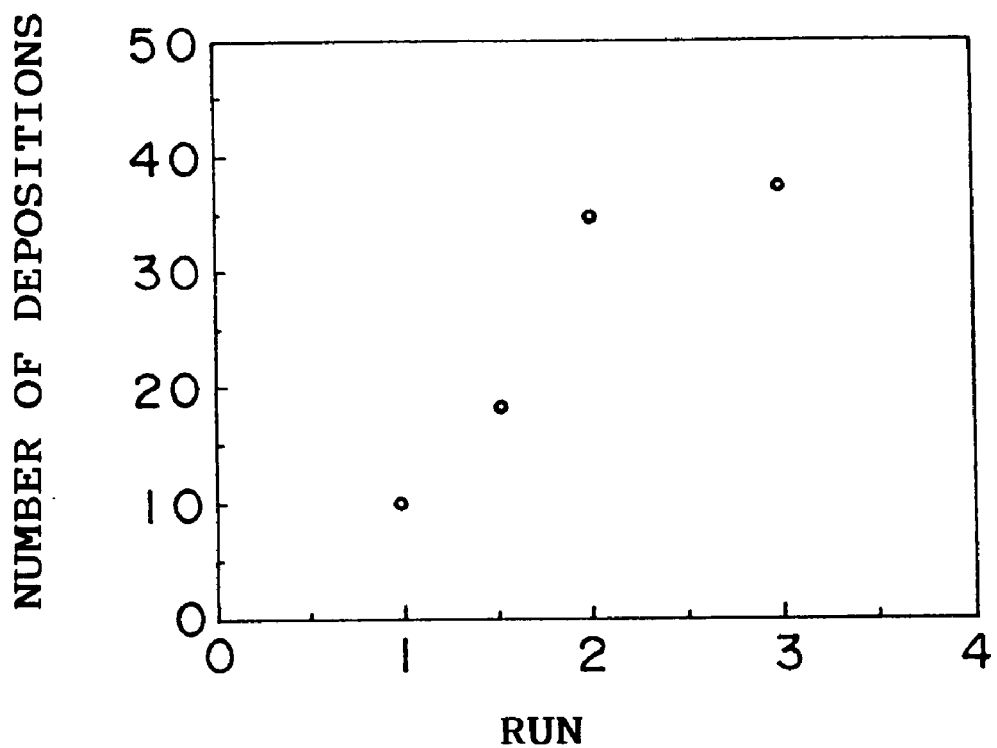
FIG. 12 is a diagram showing the relationship between the mixing ratio of tetraen and Sr(thd)$_2$ and the number of times the SrTiO$_3$ film can be deposited with a reproducible composition.

FIG. 12 shows the number of the runs that can be achieved without inviting a substantial compositional change in the deposited $SrTiO_3$ film based upon the result of FIG. 11. FIG. 12 indicates that one can conduct about 40 runs without causing a substantial compositional change in the obtained $SrTiO_3$ film from a single source material of Sr by setting the mixing ratio of tetraen and $Sr(thd)_2$ to 2 or more.

It should be noted that one can use materials such as diethylenetriamine ($H_2NCH_2CH_2NH_2NH_2$), pentaethylenehexamine (($H_2NCH_2CH_2NHCH_2CH_2NH)_2$), or 2,2', 2"triaminotriethylamine having the formula

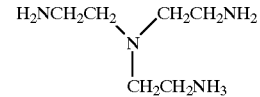

in addition to trien or tetraen described previously, for lowering the vaporization temperature of $Sr(thd)_2$ by mixing with the same.

In FIGS. 9 and 12, it will be noted that the run-to-run compositional change of the $SrTiO_3$ film is substantially reduced when any of trien or tetraen is mixed to $Sr(thd)_2$ with a mixing ratio exceeding 2. Thus, it seems that there is formed an adduct of $Sr(thd)_2$ and trien or tetraen in such a mixture such that formation of the vapor of $Sr(thd)_2$ is made stably.

In order to confirm the formation of such an adduct, a synthesis of organic compound was attempted by mixing $Sr(thd)_2$ and trien or tetraen in an organic solvent (normal hexane) with a ratio of 1:2. After evaporating the organic solvent, a whitish crystal was obtained, wherein the crystal thus obtained has a melting point of 40° C. in any of the cases where trien is used and tetraen is used. The result of microchemical analysis of the crystal indicates that the crystal obtained when mixing $Sr(thd)_2$ with trien contains C with 54.69%, H with 9.76% and N with 14.07%. For the crystal obtained as a result of mixing of $Sr(thd)_2$ and tetraen, it was confirmed that the crystal contains C with 53.50%, H with 9.58% and N with 15.93%. Thereby, the former result generally agrees with the expected composition of a compound $C_{34}H_{74}O_4N_8Sr$ (C=54.69%, H=9.99%, N=15.0%) having a formula below.

Sr(thd)$_2$ • triethylenetetramine$_2$

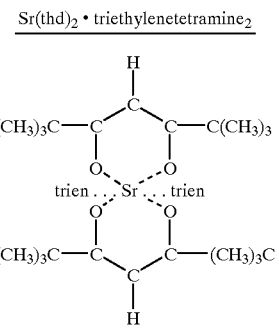

Further, the latter result generally agrees with the expected composition of a compound $C_{38}H_{84}O_4N_{10}Sr$ (C=54.81%, H=10.17%, N=16.81%) of which formula is represented as follows.

Sr(thd)$_2$ • tetraethylenepentamine$_2$

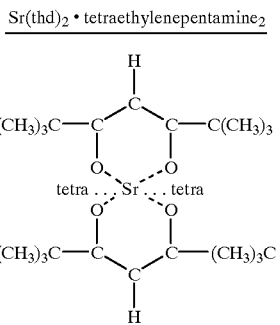

Thus, it is believed that the foregoing mixing process produces an adduct of Sr(thd)$_2$ and trien or tetraen, and the desired decrease of the vaporization temperature is obtained as a result of formation of such an adduct. In the foregoing result of analysis, the elemental composition is represented in terms of percent by weight.

It should be noted that the present invention is effective not only for the formation of SrO or SrTiO$_3$ film but also for the formation of solid solution thereof such as (Sr, Ba)O or (Sr, Ba)TiO$_3$. When forming a solid solution containing Ba, a Werner complex of Ba such as Ba(thd)$_2$ is held in a separate container as a source of Ba, in addition to the foregoing Sr source such as the organic solution of Sr((CH$_3$)$_5$C$_5$)$_2$·THF$_2$ or the mixture of Sr(thd)$_2$ and an amine compound, wherein the foregoing source of Sr and Ba are supplied together with O$_2$ to the reaction chamber. When depositing a film of (Sr, Ba)TiO$_3$ in particular, Ti(o-i-C$_3$H$_7$)$_4$ is added as the source of Ti.

Next, an example of the DRAM that uses a dielectric film or SrTiO$_3$ or (Sr, Ba)TiO$_3$ in the capacitor will be described with reference to FIG. 13 as a third embodiment of the present invention.

Figure 13:
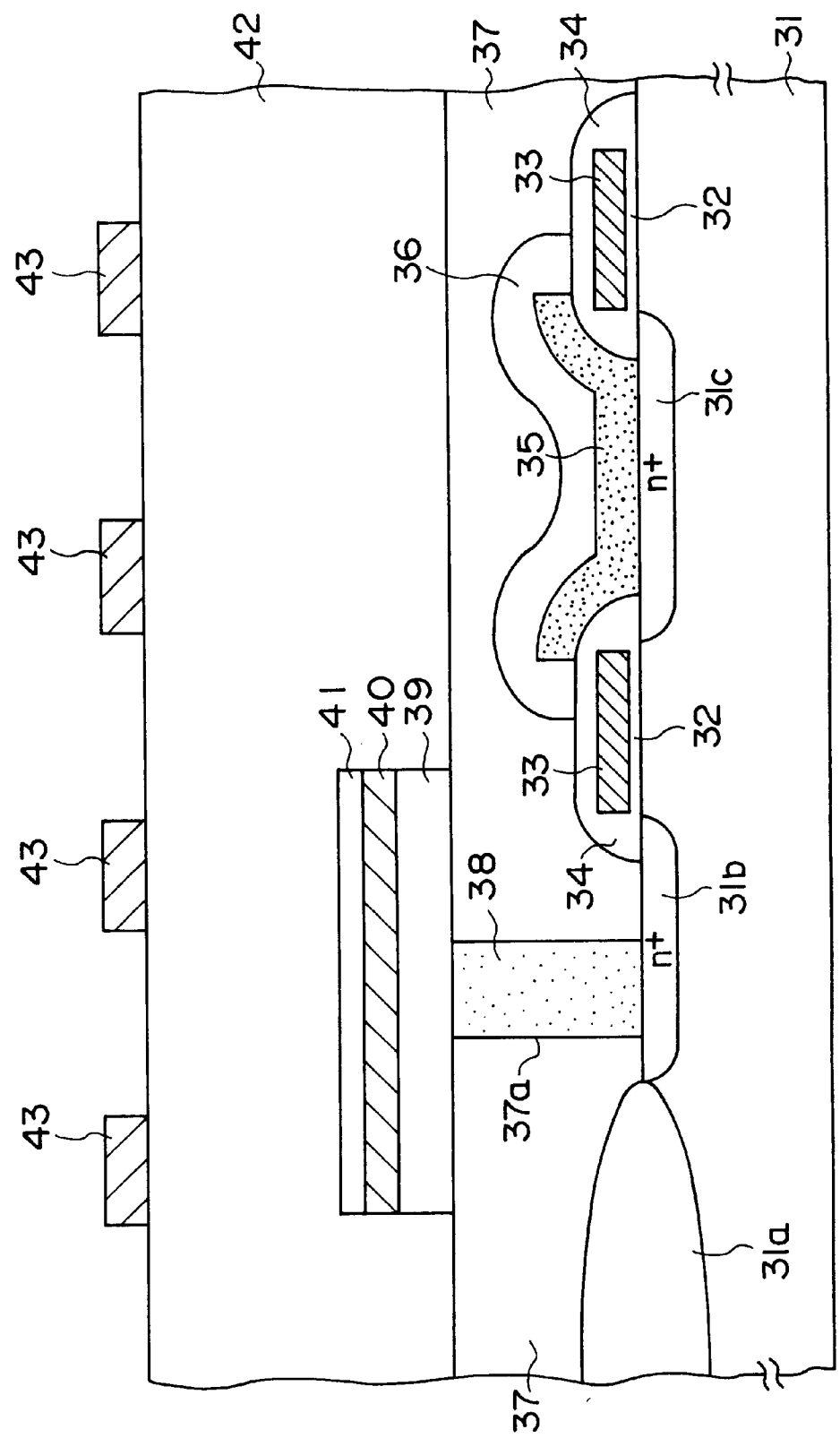
FIG. 13 is a diagram showing an example of the DRAM that uses a dielectric film of SrTiO$_3$ according to a third embodiment of the present invention.

Referring to FIG. 13, the dynamic random access memory is constructed on a p-type silicon substrate 31 carrying thereon a field oxide film 31a, wherein the field oxide film 31a defines the active region of the device as usual. Further, an n$^+$-type diffusion region 31b and an n$^+$-type diffusion region 31c are formed in the substrate 31 in correspondence to such an active region, and a gate oxide film 32 is provided on the surface of the substrate 31 so as to cover a channel region that extends between the diffusion region 31c and the diffusion region 31b. Further, a conductor pattern 33 of polysilicon or W is provided on the gate oxide film 32 as a word line, wherein the polysilicon pattern 33 is covered by a silicon oxide layer 34 that buries the conductor pattern 33 underneath.

It should be noted that the silicon oxide layer 34 is removed from the diffusion region 31c, and another conductor pattern 35 of polysilicon or W is provided in contact with the exposed diffusion region 31c as a bit line. Further, a silicon oxide layer 36 covers the conductor pattern 35.

The silicon oxide patterns 34 and 36 are covered, together with the conductor patterns 33 and 35 that are embedded therein, by a planarization layer 37 such as BPSG or SOG, and a contact hole 37a is provided in the planarization layer 37 for exposing the diffusion region 31b. The contact hole 37a is filled by polysilicon or W that forms a conductive plug 38, and an electrode pattern 39 of RuO$_2$ is provided on the planarized upper major surface of the layer 37 in contact with the conductive plug 38.

It should be noted that the electrode pattern 39 of RuO$_2$ acts as the accumulation electrode of the capacitor and a dielectric film 40 of SrTiO$_3$ or (Sr, Ba)TiO$_3$ is deposited on the electrode pattern 39 according to the process described heretofore. Further, an opposing electrode 41 of Pt or Ru is provided on the dielectric film 40 such that the dielectric film 40 is sandwiched between the electrode patterns 39 and 41. In the foregoing construction, one may provide a layer of Ru in correspondence to the lower part of the electrode 39 for protecting the conductive plug 38 from oxidation. It should be noted that the deposition of the SrTiO$_3$ film 40 as well as the deposition of the electrode pattern 39 of RuO$_2$ underneath are conducted in an oxidizing atmosphere and it is desirable to protect the exposed part of the conductive plug 38 from oxidation.

The capacitor thus formed is further covered by a planarization layer 42 as usual, wherein the planarization layer 42 carries thereon various conductor patterns 43 for interconnection.

Figure 14:
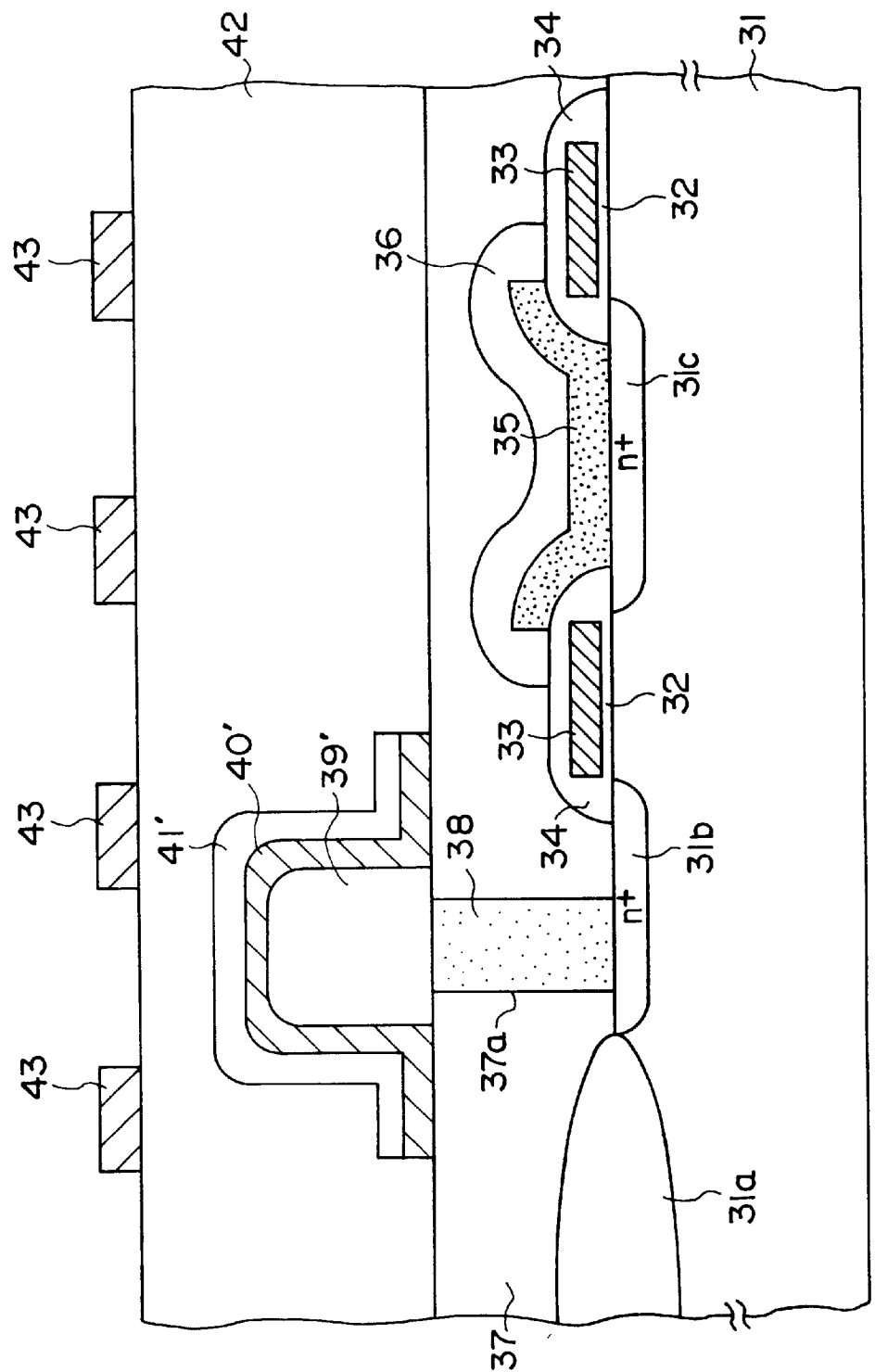
FIG. 14 is a diagram showing another example of the DRAM that uses a dielectric film of SrTiO$_3$.

FIG. 14 shows another example of the DRAM that has a capacitor formed of a dielectric film containing Sr, wherein those parts identical to the parts of FIG. 13 are designated by the same reference numerals.

In the example of FIG. 14, an electrode pattern 39' of RuO$_2$ is provided on the planarized surface of the layer 37 in electrical connection with the conductive plug 38, wherein it will be noted that a film 40' of SrTiO$_3$ or (Sr, Ba)TiO$_3$ is deposited on the electrode pattern 39' so as to cover the upper major surface as well as the side wall of the electrode pattern 39'. Further, an opposing electrode pattern 41' of Pt or Ru is provided on the dielectric film 40' in conformity with the shape of the dielectric film 40'. In this construction, too, one may form the bottom part of the electrode pattern 39' from Ru to prevent the oxidation of the conductive plug 38 when depositing the RuO$_2$ pattern 39' as well as the SrTiO$_3$ film 40'.

Further, the present invention is not limited to the embodiments described heretofore, but various variations and modifications may be made without departing from the scope of the invention.

What is claimed is:

1. A method for growing a dielectric film containing Sr on a substrate, comprising the steps of:

dissolving a Sr compound containing Sr((CH$_3$)$_5$C$_5$)$_2$ and having a first vaporization temperature into an organic solvent to form a liquid source material;

transporting said liquid source material to a site in the vicinity of a reaction chamber;

vaporizing said liquid source material to produce a gaseous source material at said site at a temperature of 100° C. to 130° C., which is lower than said first vaporization temperature, and decomposing said gaseous material, obtained in said step of vaporization, in the vicinity of a surface of a substrate held in said reaction chamber, to cause a deposition of a dielectric film containing Sr upon said surface of said substrate.

2. A method as claimed in claim 1, wherein said organic solvent is selected from a group consisting of tetrahydrofuran, acetone, xylene, acetic acid and its compounds, toluene, and benzene.

3. A method as claimed in claim 1, wherein said Sr compound contains an adduct that stabilizes $Sr((CH_3)_5C_5)_2$.

4. A method as claimed in claim 3, wherein said adduct comprises tetrahydrofuran.

5. A method as claimed in claim 1, wherein said Sr compound has a formula of $Sr((CH_3)_5C_5)_2 \cdot (THF)$.

6. A method as claimed in claim 1, wherein said step of dissolving is conducted such that said Sr compound is contained in said organic solvent with a concentration of 0.01–0.09 mol/l.

7. A method as claimed in claim 1, wherein said step of vaporization is conducted such that said gaseous source material has a partial pressure of 0.01–150 Torr.

8. A method as claimed in claim 1 further comprising a step of supplying an metal organic complex of Ti to said reaction chamber substantially simultaneously to said gaseous source material, wherein said step of decomposing said gaseous source material causes a deposition of a dielectric film hating a composition of $SrTiO_3$ upon said substrate.

9. A method as claimed in claim 1 further comprising a step of supplying an metal organic complex of Ti and a Werner complex of Ba to said reaction chamber substantially simultaneously to said gaseous source material, wherein said step of decomposing said gaseous source material causes a deposition of a dielectric film having a composition of $(Sr,Ba)TiO_3$ upon said substrate.

10. A method as claimed in claim 1, wherein said step of vaporizing said liquid source material is conducted at a temperature of about 130° C.

11. A method for growing a dielectric film containing Sr on
a substrate, comprising the steps of:
mixing $Sr(thd)_2$ with an amine compound to form a mixture in the form of a solid;
vaporizing said mixture to produce a gaseous source material;
transporting said gaseous source material to a reaction chamber; and
decomposing said gaseous source material in the vicinity of a surface of a substrate held in said reaction chamber to cause a deposition of a dielectric film containing Sr upon said substrate,
wherein said amine compound is selected from the group consisting of triethylenetetramine, tetraethylenepentamine, diethylenetriamine, pentaethylenehexamine, and 2, 2', 2" triaminotriethylamine.

12. A method as claimed in claim 11, wherein said amine compound is selected from a group consisting of triethylenetetramine, tetraethylenepentamine, diethylenetriamine, pentaethylenehexamine, and 2,2', 2"triaminotriethylamine.

13. A method as claimed in claim 11, wherein said step of mixing is conducted such that said amine compound is mixed in two or more moles with respect to one mole of $Sr(thd)_2$.

14. A method as claimed in claim 13, wherein said step of mixing is conducted such that an adduct of $Sr(thd)_2$ and said amine compound is formed.

15. A method for fabricating a semiconductor device having a dielectric film containing Sr, comprising the steps of:
dissolving a Sr compound containing $Sr((CH_3)_5C_5)_2$ having a first vaporization temperature into an organic solvent to form a liquid source material;
transporting said liquid source material to a site in the vicinity of a reaction chamber;
vaporizing said liquid source material at said site at a temperature of 100° C. to 130° C., which is lower than said first vaporization temperature, to produce a gaseous source material; and
decomposing said gaseous source material, obtained in said step of vaporizing, in the vicinity of a surface of a substrate held in said reaction chamber, to cause a deposition of a dielectric film containing Sr upon said surface of said substrate.

16. A method for fabricating a semiconductor device having a dielectric film containing Sr, comprising the steps of:
mixing $Sr(thd)_2$ with an amine compound to form a mixture in the form of a solid;
vaporizing said mixture to produce a gaseous source material;
transporting said gaseous source material to a reaction chamber; and
decomposing said gaseous source material in the vicinity of a surface of a substrate held in said reaction chamber to cause a deposition of dielectric film containing Sr upon said substrate,
wherein said amine is selected from the group consisting of triethylenetetramine, tetraethylenepentamine, diethylenetriamine, pentaethylenehexamine, and 2, 2', 2" triaminotriethylamine.

17. A method for growing a dielectric film containing Sr on a substrate, comprising the steps of:
mixing $Sr(thd)_2$ with an amine compound to form a mixture in the form of a solid, said amine compound containing three or more amine groups;
vaporizing said mixture to produce a gaseous source material;
transporting said gaseous source material to a reaction chamber; and
decomposing said gaseous source material in the vicinity of a surface of a substrate held in a reaction chamber to cause a deposition of a dielectric film containing Sr upon said substrate.

18. A method for fabricating a semiconductor device having a dielectric film containing Sr, comprising the steps of:
mixing $Sr(thd)_2$ with an amine compound to form a mixture in the form of a solid, said amine compound containing three more amine groups;
vaporizing said mixture to produce a gaseous source material;
transporting said gaseous source material to a reaction chamber; and
decomposing said gaseous source material in the vicinity of a surface of a substrate held in a reaction chamber to cause a deposition of a dielectric film containing Sr upon said substrate.

* * * * *